United States Patent
Gao et al.

(10) Patent No.: US 9,704,819 B1
(45) Date of Patent: Jul. 11, 2017

(54) THREE DIMENSIONAL FULLY MOLDED POWER ELECTRONICS MODULE HAVING A PLURALITY OF SPACERS FOR HIGH POWER APPLICATIONS

(71) Applicant: Hong Kong Applied Science and Technology Research Institute Co. Ltd., Hong Kong (CN)

(72) Inventors: Ziyang Gao, Hong Kong (CN); Ya Lv, Hong Kong (CN)

(73) Assignee: Hong Kong Applied Science and Technology Research Institute Co. Ltd., Hong Kong (CN)

( * ) Notice: Subject to any disclaimer, the term of this patent is extended or adjusted under 35 U.S.C. 154(b) by 0 days.

(21) Appl. No.: 15/084,442

(22) Filed: Mar. 29, 2016

(51) Int. Cl.
| | |
|---|---|
| *H01L 23/34* | (2006.01) |
| *H05K 7/10* | (2006.01) |
| *H01L 21/00* | (2006.01) |
| *H01L 23/00* | (2006.01) |
| *H01L 25/00* | (2006.01) |
| *H01L 21/66* | (2006.01) |
| *H01L 23/31* | (2006.01) |
| *H01L 25/065* | (2006.01) |
| *H01L 23/498* | (2006.01) |

(52) U.S. Cl.
CPC ............ *H01L 24/14* (2013.01); *H01L 22/20* (2013.01); *H01L 23/3107* (2013.01); *H01L 24/17* (2013.01); *H01L 25/0657* (2013.01); *H01L 25/50* (2013.01); *H01L 23/49833* (2013.01); *H01L 2225/1058* (2013.01); *H01L 2225/1088* (2013.01); *H01L 2225/1094* (2013.01)

(58) Field of Classification Search
CPC ........... H01L 23/3107; H01L 23/49833; H01L 25/0567; H01L 25/105; H01L 22/20; H01L 25/50; H01L 24/17; H01L 24/141
See application file for complete search history.

(56) References Cited

U.S. PATENT DOCUMENTS

| | | | | |
|---|---|---|---|---|
| 6,583,503 B2 * | 6/2003 | Akram | ................... | H05K 1/144 257/678 |
| 7,557,434 B2 | 7/2009 | Malhan et al. | | |
| 7,692,279 B2 * | 4/2010 | Karnezos | ................ | H01L 25/03 257/686 |

(Continued)

FOREIGN PATENT DOCUMENTS

EP      2306796 A1     4/2011

OTHER PUBLICATIONS

Mouawad, Bassem et al., Direct Copper Bonding for Power Interconnects: Design, Manufacturing and Test, DOI: 10.1109/TCPMT.2014.2376882.

*Primary Examiner* — Alonzo Chambliss
(74) *Attorney, Agent, or Firm* — Eagle IP Limited; Jacqueline C. Lui

(57) ABSTRACT

A power electronic package includes a first substrate, a second substrate oppositely disposed from the first substrate, one or more chips disposed between the substrates, and at least three spacers. The spacers control a height variation of the power electronic package and protect the chips and other electronics from experiencing excessive stress. The height of the spacers is determined based on a height of the chips, on a height of solder blocks that connect the chips to the top substrate, and on a height of solder blocks that connect the chips to the bottom substrate.

20 Claims, 5 Drawing Sheets

(56) References Cited

U.S. PATENT DOCUMENTS

| | | | |
|---|---|---|---|
| 8,970,049 B2* | 3/2015 | Karnezos | H01L 23/4334 257/686 |
| 2005/0133932 A1* | 6/2005 | Pohl | H01L 23/04 257/777 |
| 2007/0119617 A1 | 5/2007 | Hayashi et al. | |
| 2007/0278658 A1* | 12/2007 | Karnezos | H01L 25/03 257/692 |
| 2008/0054425 A1 | 3/2008 | Malhan et al. | |
| 2008/0142957 A1* | 6/2008 | Wang | H01L 24/32 257/723 |
| 2009/0116197 A1* | 5/2009 | Funakoshi | H01L 21/4882 361/719 |
| 2012/0243192 A1 | 9/2012 | Robert et al. | |
| 2013/0020694 A1 | 1/2013 | Liang et al. | |

\* cited by examiner

THREE DIMENSIONAL FULLY MOLDED POWER ELECTRONICS MODULE HAVING A PLURALITY OF SPACERS FOR HIGH POWER APPLICATIONS

FIELD OF THE INVENTION

The present invention relates to a power electronic package or a fully molded power electronic module.

BACKGROUND

Power semiconductor chips are used in many high power applications, such as hybrid electric vehicles and other transportation and energy systems. Power semiconductor chips such as metal-oxide semiconductor field-effect transistors (MOSFETs), insulated gate bipolar transistors (IGBTs), and diodes produce large amounts of heat. Consequently, when these semiconductor chips are built into packages, it is desired to dissipate the heat generated by these chips quickly and efficiently. The package for such power semiconductor chips is required to meet stringent performance criteria, such as providing high and reliable power over a long service life. Further, the power electronic packages serve to provide electrical interconnections, thermal dissipation, and mechanical support for the chips and other components housed inside.

In view of the demand for high power packaging, improvements in reliability and thermal performance are desired.

SUMMARY OF THE INVENTION

Figure 1:
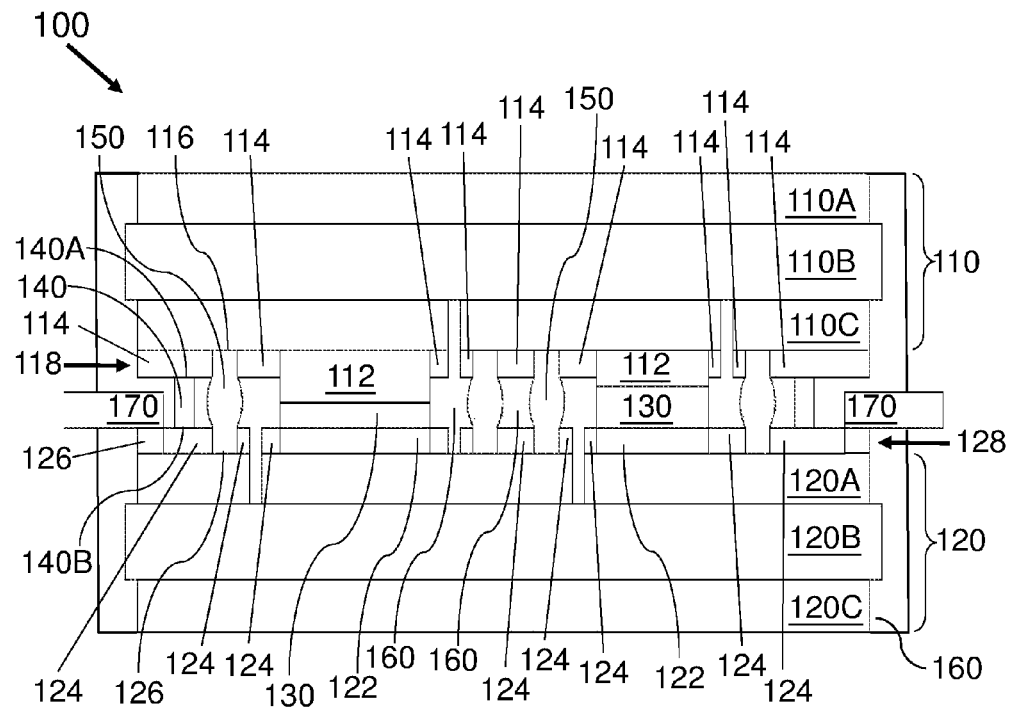
FIG. 1 shows a side view of a power electronic package in accordance with an example embodiment.

One example embodiment is a power electronic package that includes a first substrate, a second substrate oppositely disposed from the first substrate, one or more chips disposed between the substrates, and at least three spacers. The spacers control a height variation of the power electronic package and protect the chips and other electronics from experiencing excessive stress. The height of the spacers is determined based on a height of the chips, on a height of solder blocks that connect the chips to the top substrate, and on a height of solder blocks that connect the chips to the bottom substrate.

Other example embodiments are discussed herein.

DETAILED DESCRIPTION

Example embodiments relate to apparatus and methods that provide a power electronic package that includes one or more chips housed in a power electronic package or module that dissipates heat.

An example embodiment includes a power electronic package with a top substrate and a bottom substrate oppositely disposed from the top substrate. The power electronic package serves to provide electrical interconnections, thermal dissipation, and mechanical support for a plurality of high power chips sandwiched between the top and bottom substrates. The power electronic package includes spacers each having a first end that contacts the top substrate and a second end that contacts the bottom substrate. The height of the spacers is determined based on a height of the chips, on a height of solder blocks that bond the chips to the top substrate, and on a height of solder blocks that bond the chips to the bottom substrate.

The spacers are disposed between the top and bottom substrates and provide a mechanism to control a height of the power electronic package according to the specific chips provided in each package. The height of the spacers is tailored or designed according to the height of the chips, amount of solder being used, and other criteria discussed herein. A height variation of the power electronic package is thus controlled by the spacers.

In one example embodiment, a plurality of solder blocks are disposed between a top surface of the chips and the top substrate, and a plurality of solder bases are disposed between a bottom surface of the chips and the bottom substrate. The solder blocks and solder bases provide electrical paths for the chips to connect with the top substrate and the bottom substrate.

In one example embodiment, a height of the spacers is determined based on thermal properties of the substrates and the chips sandwiched in between such that heat generated by the high power chips is dissipated efficiently. A height variation of the power electronic package is precisely controlled by the spacers to be less than 0.1 mm in order to reduce mechanical stress and the collapse rate of the solder blocks.

In one example embodiment, the spacers are spaced around a perimeter of the power electronic package or adjacent one or more corners of the power electronic package in order to divert the load away from the chips and solder blocks and reduce mechanical stress on electrical components in the power electronic package.

FIG. 1 shows a side view of a power electronic package or power electronic module 100. The power electronic package 100 includes a plurality of dies or chips 130 positioned or sandwiched between a top or first direct bonded copper (DBC) substrate 110 and a bottom or second DBC substrate 120.

As one example, the top DBC substrate comprises a ceramic base 110B and two copper layers 110A and 110C that are bonded onto top and bottom sides of the ceramic base 110B. The top DBC substrate 110 has a patterned inner surface 118 that includes a first passivation region or electrically non-conductive region 114 and a first conductive region 116.

The bottom DBC substrate 120 has a patterned inner surface 128 that includes a second passivation region or electrically non-conductive region 124 and a second conductive region 126. The passivation regions are formed on inner surfaces of bottom and top DBC substrates by, for an example, oxidizing the copper, such that the non-oxidized region is defined as electrical connection paths and solderable areas on the inner surfaces 118 and 128.

A first plurality of solder blocks or solder balls 112 are disposed between a top surface of the chips 130 and the first conductive region 116 of the top DBC substrate 110, and a second plurality of solder blocks or solder bases 122 are disposed between a bottom surface of the chips 130 and the second conductive region 126 of the bottom DBC substrate 120.

One or more spacers 140 are disposed between the top DBC substrate 110 and the second DBC substrate 120. Each spacer has a first end or terminal 140A and a second end of terminal 140B. The first end 140A contacts or abuts the first passivation region 114 of the top DBC substrate 110, and the second end 140B contacts or abuts the second passivation region 124 of the bottom DBC substrate 120.

In an example embodiment, a height of the spacer 140 is equal to a sum of a height of the chips 130, a height of the first plurality of solder blocks 112, and a height of the second plurality of solder blocks 122. The height variation of the power electronic package is precisely controlled to be less than 0.1 mm. The small variation of height reduces mechanical stress on the chips and the solder blocks introduced in the moldering process and reduce the collapse rate of the solder blocks.

As shown in FIG. 1, the power electronic package 100 further includes a third plurality of solder blocks or solder balls 150 that contact the first conductive region 116 of the top DBC substrate 110 and contact the second conductive region 126 of the bottom DBC substrate 120 to electrically connect the top DBC substrate with the bottom DBC substrate. In one example embodiment, a height of the solder balls is 60%-80% of the width of the solder balls.

As shown in FIG. 1, the power electronic package 100 also includes a molding compound or encapsulant 160 that fills the gaps between the top DBC substrate and the bottom DBC substrate by a fully molding process or a transfer molding process. For example, a silicone gel or epoxy mold compound (EMC) is introduced into open cavities inside the package to provide a locking mechanism and improve the reliability of the package. As one example, the outer surfaces of the substrates 110 and 120 or portions thereof are not covered by the molding compound in order to efficiently dissipate heat to ambient air.

As shown in FIG. 1, the power electronic package 100 also includes lead frames 170 that are soldered or otherwise attached to the bottom DBC to form electrical connections to external devices.

Figure 2:
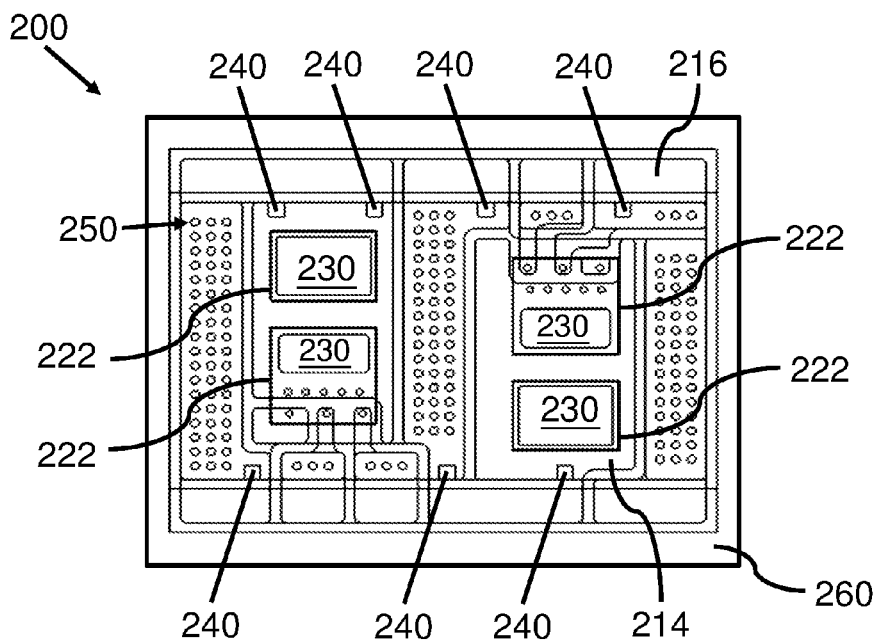
FIG. 2 shows a transparent view of a power electronic package in accordance with an example embodiment.

FIG. 2 shows a transparent view of a power electronic package or power electronic module 200. The power electronic package 200 includes a plurality of dies or chips 230 mounted on a solder block or solder base 222. The chips are positioned or arranged such that each of the chips is in electrical contact with a solder base. A plurality of spacers 240 are spaced around a perimeter of the power electronic package. As one example, the spacers are positioned adjacent the corners of the power electronic package. The spacers, for example, are formed of silicon and have a cross sectional shape of a circle or a polygon.

As shown in FIG. 2, the power electronic package 200 further includes a plurality of electrically non-conductive regions or passivation regions 214 and conductive regions 216. The conductive regions 216 define electrical connection paths for the chips 230 mounted on the solder bases 222 and define solderable areas.

As shown in FIG. 2, the power electronic package 200 further includes a plurality of solder blocks or solder balls 250 that contact the conductive region 216. In one example embodiment, a height of the solder balls is 60%-80% of the width of the solder balls.

As shown in FIG. 2, the power electronic package 200 also includes a molding compound or encapsulant 260 by a fully molding process or a transfer molding process. For example, a silicone gel or epoxy mold compound (EMC) is introduced into open cavities inside the package to provide a locking mechanism and improve the reliability of the package.

Figure 3:
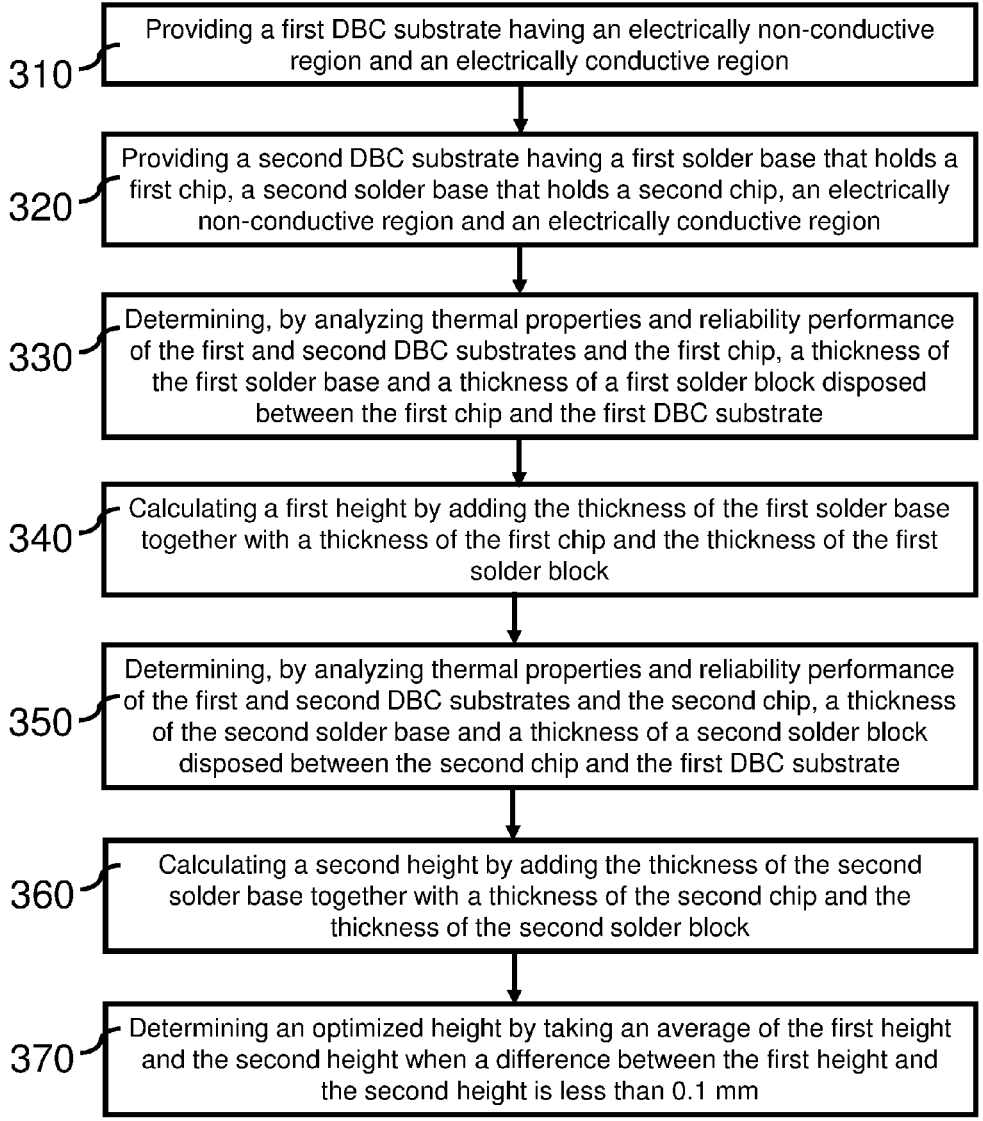
FIG. 3 shows a method of determining a thickness of a spacer in a power electronic package in accordance with an example embodiment.

FIG. 3 shows a method of determining a thickness of the spacers in accordance with an example embodiment.

According to block 310, a first DBC substrate having an electrically non-conductive region and an electrically conductive region are provided. As one example, the non-conductive region is defined through a passivation process to oxidize copper on the first DBC substrate along a predetermined path.

According to block 320, a second DBC substrate having a first solder base that holds a first chip, a second solder base that holds a second chip, an electrically non-conductive region and an electrically conductive region are provided. As one example, the size of the solder bases are predetermined and pre-formed by dicing or cutting a silicon wafer. The solder bases are attached to the second DBC substrate via solder pastes that are printed on the second DBC substrate. Thereafter, a plurality of chips are mounted on the solder bases.

According to block 330, a thickness of the first solder base and a thickness of a first solder block disposed between the first chip and the first DBC substrate are determined by analyzing thermal properties and reliability performance of the first and second DBC substrates and the first chip.

As one example, creep analysis and thermal analysis are performed to determine fatigue life of the solder blocks connected to the first and second DBC substrates and the first chip. Creep refers to the tendency of the solder to move or deform while under the influence of mechanical stresses.

As another example, thermal analysis and simulation are performed to determine the thermal resistance of the first and second DBC substrates and the first chip. Thermal analysis refers to the study of changes to properties of a material that is subjected to changes in temperature. In one example embodiment, numerical modeling and finite element simulations are performed to determine the thermal resistance between the junction of the first chip and the second substrate in consideration of different geometrical parameters and material properties. The thickness and shape of the second solder block can be justified according to the thermal design requirements.

In an example embodiment, a thicknesses of the first solder base is determined via software modeling and simulations according to design requirements for the power electronic package. As another example, a thickness of the first solder block disposed between the first chip and the first DBC substrate is determined based on the results of the creep analysis and the thermal analysis and on the type of the first solder block and its corresponding sitting opening. As one example, there are trade-offs between the fatigue life and thermal resistance. Therefore, a balance point is picked between these two parameters based on the criteria and the design requirements for the power electronic package.

According to block 340, a first height is calculated by adding the thickness of the first solder base together with a thickness of the first chip and the thickness of the first solder block.

According to block 350, a thickness of the second solder base and a thickness of a second solder block disposed between the second chip and the first DBC substrate are determined by analyzing thermal properties and reliability performance of the first and second DBC substrates and the second chip. As one example, creep analysis and thermal analysis are performed to determine fatigue life of the solder blocks connected to the first and second DBC substrates and the second chip. As another example, thermal analysis and simulation are performed to determine the thermal resistance of the first and second DBC substrates and the second chip. A thicknesses of the second solder base is then determined via software modeling and simulations according to design requirements. As another example, a thickness of the second solder block disposed between the second chip and the first DBC substrate is determined based on the results of the creep analysis and the thermal analysis and on the type of the second solder block and its corresponding sitting opening.

According to block 360, a second height is calculated by adding the thickness of the second solder base together with a thickness of the second chip and the thickness of the second solder block.

According to block 370, an optimized height is determined by taking an average of the first height and the second height when a difference between the first height and the second height is less than 0.1 mm. As one example, if the first height calculated by block 340 is 4 mm and the second height calculated by block 360 is 4.04 mm, the optimized height is determined to be 4.02 mm. As another example, if the first height calculated by block 340 is 4.0 mm and the second height calculated by block 360 is 4.2 mm, the process is sent back to block 330 to determine another first height and second height until the difference between the first height and the second height is less than 0.1 mm.

As an example embodiment, if the first height calculated by block 340 is 4 mm, the second height calculated by block 360 is 4.04 mm, and a third height, which is a sum of the thickness of a third chip, a third solder base that bonds the third chip to the second DBC substrate, and a third solder block that bonds the third chip to the first DBC substrate, is calculated to be 4.2 mm, then the process is looped back for the third chip to re-calculate the third height so that the final height difference among the first height, the second height and the third height is less than 0.1 mm. Otherwise, the power electronic assembly sustains too much mechanical force or stress, which may cause failure of the chips and other electronics housed in the assembly.

Figure 4:
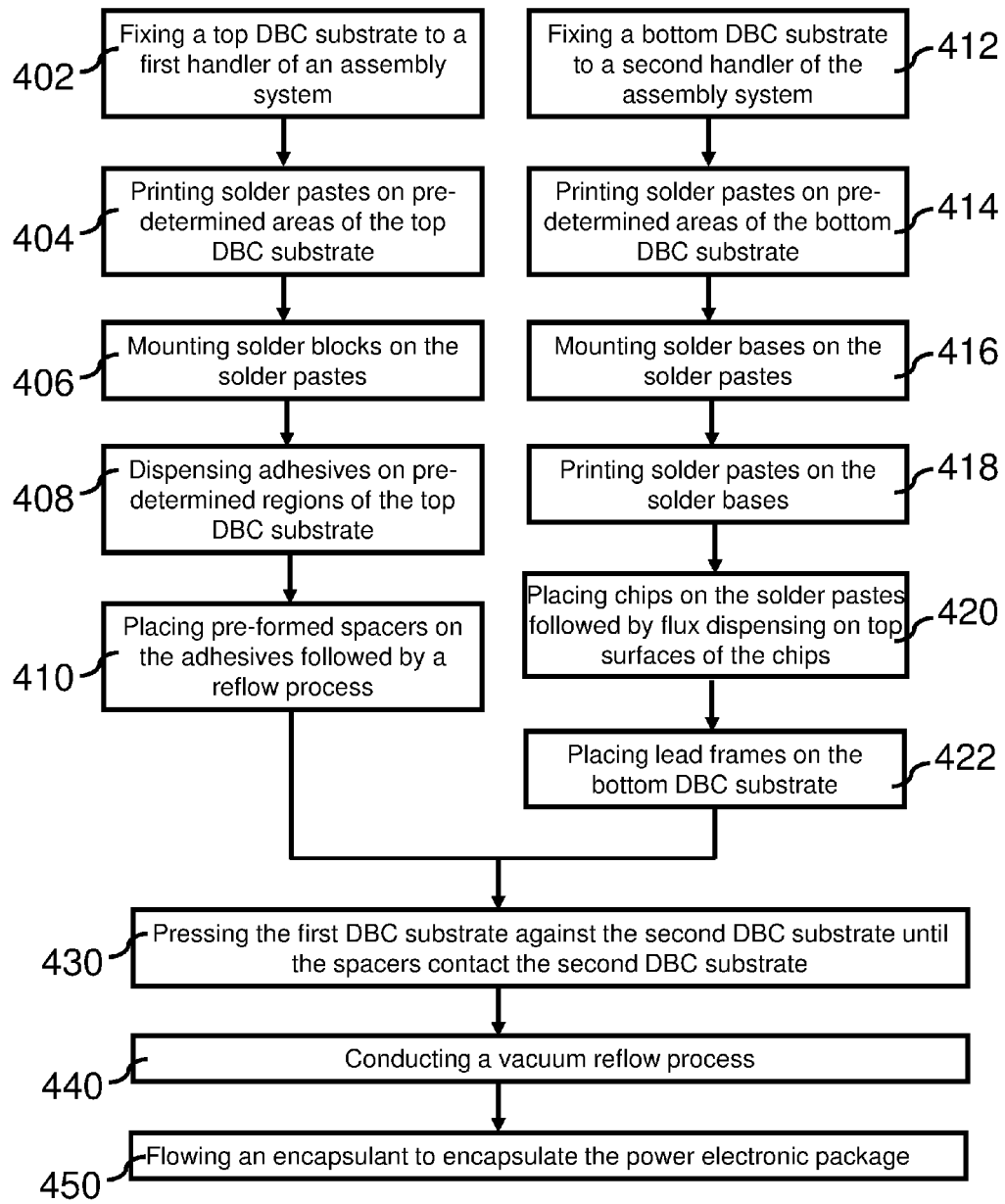
FIG. 4 shows a method to fabricate a power electronic package in accordance with an example embodiment.

FIG. 4 shows a process to fabricate a power electronic package in accordance with an example embodiment.

According to block 402, a top DBC substrate is fixed to a first handler of an assembly system. As one example, the assembly system has a plurality of handlers that can hold and fix substrates. As another example, the handlers also hold other components, such as chips and pre-formed spacers in proper alignment with respect to the substrates such that the components maintain a correct positional relationship during assembly and heating treatment.

According to block 404, solder pastes are printed on pre-determined areas of the top DBC substrate in order to attach solder blocks to the top DBC substrate.

According to block 406, solder blocks are mounted on the solder pastes by a handler of the assembly system.

According to block 408, adhesives are dispensed on pre-determined regions of the top DBC substrate in order to attach spacers to the top DBC substrate. For one example, the precise positioning and quantity of adhesives to be dispensed on the pre-determined regions are precisely controlled by a dispensing system.

According to block 410, pre-formed spacers are placed on the adhesives followed by a reflow process. For one example, at least three spacers that have a height equal to the optimized height that is determined by method as shown in FIG. 3 are attached to the adhesives. As another example, the reflow process is a heating process to melt the pastes or adhesives and form a mechanical connection and/or an electrical connection. The spacers, for example, are formed of silicon and have a cross sectional shape of a circle or a polygon.

According to block 412, a bottom DBC substrate is fixed to a second handler of the assembly system. As one example, the assembly system has a plurality of handlers that can hold and fix substrates. As another example, the handlers also hold other components, such as chips and pre-formed spacers in proper alignment with respect to the substrates such that the components maintain a correct positional relationship during assembly and heating treatment.

According to block 414, solder pastes are printed on pre-determined areas of the bottom DBC substrate in order to attach solder bases to the bottom DBC substrate.

According to block 416, solder bases are mounted on the solder pastes by a handler of the assembly system.

According to block 418, solder pastes are printed on the solder bases in order to attach chips to the bottom DBC substrate.

According to block 420, chips are placed on the solder pastes followed by a flux dispensing process on top surfaces of the chips to prepare the chips for connecting with the solder blocks on the top DBC substrate. By way of example, the flux dispensing process includes a chemical cleaning agent and a flowing agent to facilitate soldering by removing oxidation from the metals to be joined as well as sustaining the solid characteristic shapes of the solder blocks prior to being melted.

According to block 422, lead frames are placed on the bottom DBC substrate to form electrical connections to external devices.

According to block 430, the first DBC substrate is pressed against the second DBC substrate until the spacers contact the second DBC substrates. The chips that are mounted on the second DBC substrate also connect to the solder blocks on the first DBC substrate by this pressing step since the height of the spacers are precisely designed for such a connection. The height variation of the power electronic package is precisely controlled by the spacers to be less than 0.1 mm in order to reduce mechanical stress and the collapse rate of the solder blocks and chips introduced in the molding process.

According to block 440, a reflow process in conducted under vacuum environment to melt, for example, the solder blocks and form mechanical and/or electrical connections.

According to block 440, an encapsulant is flowed to encapsulate the power electronic package. For one example, fillers such as silicone gel or epoxy mold compound (EMC) fill the open cavities inside the package to provide locking mechanism and improve the reliability of the package.

Figure 5:
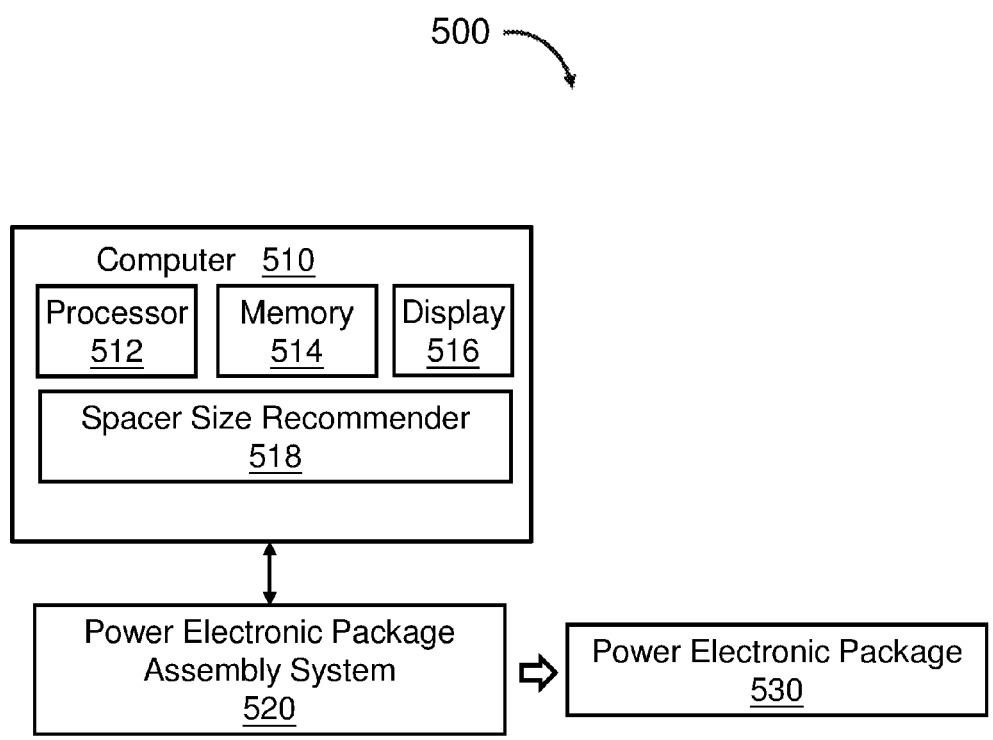
FIG. 5 shows a system that fabricates a power electronic package in accordance with an example embodiment.

FIG. 5 shows a system 500 that fabricates a power electronic package in accordance with an example embodiment. The system 500 includes a computer 510 and a power electronic package assembly system 520. The computer 510 includes a processor 512, a memory 514, a display 516 and a spacer size recommender 518. The processor 512 communicates with the memory 514 and the spacer size recommender 518, which provides a recommendation to the power electronic package assembly system 520 of a spacer size by analyzing thermal properties of the substrates and the chips. The space size recommender 518 includes software and/or hardware to execute one or more blocks discussed herein to determine a size for the spacers. The power electronic package assembly system 520 then fabricates a power electronic package 530 that includes a spacer with the recommended size.

Figure 6A:
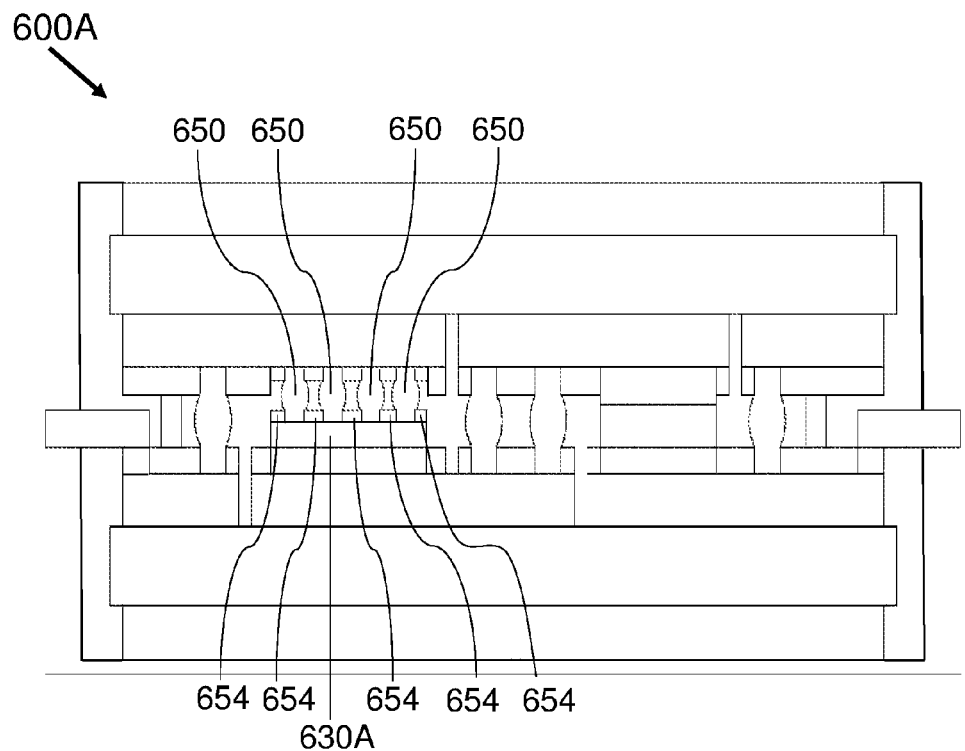
FIG. 6A shows a side view of a power electronic package in accordance with an example embodiment.

FIG. 6A shows a side view of a power electronic package 600A in accordance with an example embodiment. The power electronic package 600A is the same or similar as the power electronic package 100 disclosed in FIG. 1. As one difference, chip 630A is bonded to the top DBC substrate through solder balls 650. A plurality of passivation regions 654 are disposed on a top surface of the chip 630A and on an inner surface of the top DBC substrate that faces the chip. The distance between the neighbor passivation regions on the chip or on the inner surface of the top DBC substrate defines a sitting opening of each solder ball. As one example, the sitting opening of the solder balls is 80% of the diameter of the solder balls.

The solder balls contact the top DBC substrate and the chip 630A to electrically and mechanically connect the chip with the top DBC substrate. In one example embodiment, a height of the solder balls is 60%-80% of the width of the solder balls.

Figure 6B:
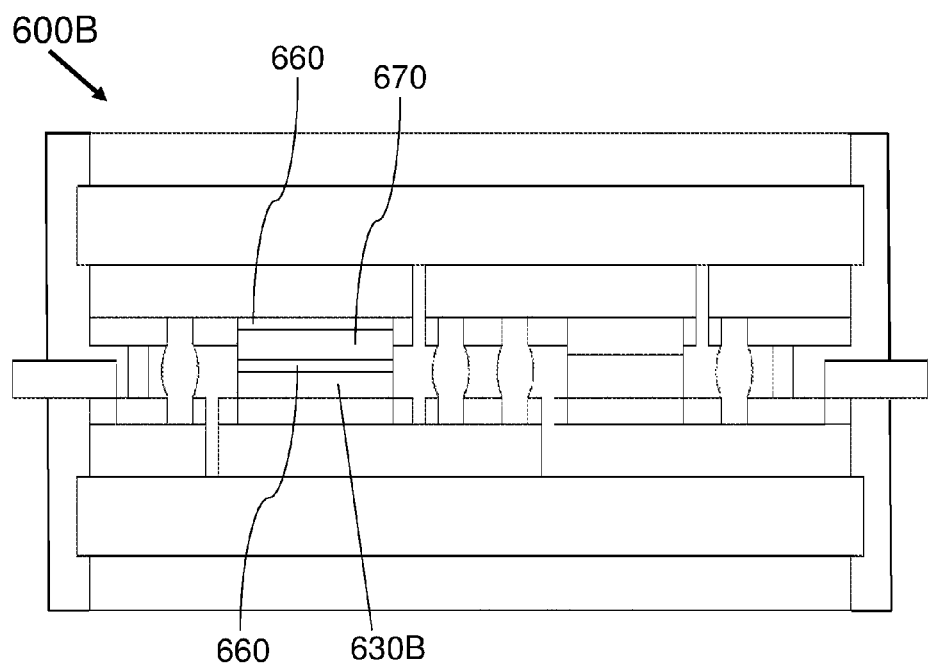
FIG. 6B shows a side view of a power electronic package in accordance with another example embodiment.

FIG. 6B shows a side view of a power electronic package 600B in accordance with another example embodiment. The power electronic package 600B is the same or similar as the power electronic package 100 disclosed in FIG. 1. As one difference, chip 630B is bonded to the top DBC substrate through a combination of solder and copper material. A copper layer 670 is sandwiched between two solder layers 660 such that the solder layer at the bottom is electrically and mechanically connected to the chip and the solder layer at the top is connected to the top DBC substrate.

The criteria used to evaluate a power module include parasitic inductance, parasitic resistance, and thermal impedance. Compared with a power module with wire-bonding, the parasitic inductance and parasitic resistance of the circuitry is reduced by up to 89%. Furthermore, since heat can be dissipated through both the top DBC substrate and the bottom DBC substrate, the junction-case thermal resistance is reduced by up to 54%, As used herein, a "conductive region" is a region that is formed of a conductive material that allows the flow of electricity. Examples of a conductive material include, but are not limited to, copper, silver, gold, aluminum, zinc, nickel, brass, and other conductive material (such as other metals, graphite, polymers, and semiconductors).

As used herein, "fully molded power electronic module" is a power electronic assembly or module that is encapsulated by an encapsulant except for the exposed surfaces for heat dissipation.

As used herein, a "power electronic package" or a "power electronic module" is an electronic package or electronic module that contains power semiconductor devices. Examples of power semiconductor devices include, but are not limited to, MOSFET, diode, IGBT, bipolar junction transistor (BJT), thyristor, gate turn-off thyristor (GTO) and junction gate field-effect transistor (JFET).

As used herein, a "solder block" is a solder material having a ball shape, a cube shape, or another shape and includes metals and metal alloys.

As used herein, a "solder paste" is a material made up of a plurality of discrete particles of solder material suspended in a carrier such as a flux or other carrier agent to facilitate application to a substrate via a conventional stenciling or similar process.

What is claimed is:
1. A power electronic package, comprising:
a first substrate having a patterned inner surface that includes a first conductive region;
a second substrate oppositely disposed from the first substrate and having a patterned inner surface that includes a second conductive region;
a plurality of chips sandwiched between the first substrate and the second substrate and each of the chips having a top surface and a bottom surface;
a first plurality of solder blocks disposed between the top surface of the chips and the first conductive region of the first substrate;
a second plurality of solder blocks disposed between the bottom surface of the chips and the second conductive region of the second substrate; and
at least three spacers each having a first end that contacts the first substrate, a second end that contacts the second substrate, and a height that is based on a height of the chips, on a height of the first plurality of solder blocks, and on a height of the second plurality of solder blocks such that the height variation of the power electronic package is controlled by the spacers;
wherein the first substrate includes a ceramic layer sandwiched between two electrically conductive layers and the second substrate includes a ceramic layer sandwiched between two electrically conductive layers.

2. The power electronic package of claim 1, wherein the height of the spacers is an average of a first total height and a second total height when a difference between the first total height and the second total height is in a range of 0.0 mm to 0.1 mm, wherein the first total height equals a height of a first chip plus a height of the first solder blocks that connect the first chip to the first substrate, and a height of the second solder blocks that connect the first chip to the second substrate, and the second total height equals a height of a second chip plus a height of the first solder blocks that connect the second chip to the first substrate, and a height of the second solder blocks that connect the second chip to the second substrate, wherein the height of the second solder blocks is determined by analyzing thermal properties and reliability performance of the power electronic package.

3. The power electronic package of claim 1, wherein the first plurality of solder blocks are solder balls with a height of 60% to 80% of a width of the solder balls.

4. The power electronic package of claim 1, wherein each of the chips includes a total height that equals the height of the chip plus the heights of the first and second solder blocks, and a difference between the total height of each of the chips is in a range of 0.0 mm to 0.1 mm.

5. The power electronic package of claim 1 further comprising:
a third plurality of solder blocks that contact the first conductive region of the first substrate and contact the second conductive region of the second substrate.

6. The power electronic package of claim 1 further comprising:
a molding compound that encapsulates the power electronic package including the first substrate, the second substrate, and the chips.

7. The power electronic package of claim 1, wherein an outer surface of the first substrate and the second substrate is exposed directly to ambient air.

8. The power electronic package of claim 1, wherein the spacers are formed of silicon and have a cross sectional shape as one of a circle-shape and a polygon-shape.

9. A fully molded power electronic module, comprising:
a first direct bonded copper (DBC) substrate;
a second DBC substrate oppositely disposed from the first DBC substrate;

a plurality of chips sandwiched between the first DBC substrate and the second DBC substrate and each of the chips having a top surface and a bottom surface;

a first plurality of solder blocks disposed between the top surface of the chips and the first DBC substrate;

a second plurality of solder blocks disposed between the bottom surface of the chips and the second DBC substrate; and four spacers each having a first end that contacts the first DBC substrate, a second end that contacts the second DBC substrate, and a height that is equal to a height of one of the chips plus a height of one of the first plurality of solder blocks plus a height of one of the second plurality of solder blocks such that the spacers divert load from the chips to the spacers.

10. The fully molded power electronic module of claim 9, wherein the first plurality of solder blocks are solder balls with a height of 60% to 80% of a width of the solder balls.

11. The fully molded power electronic module of claim 9, wherein each of the chips includes a total height that equals the height of the chip plus the heights of the first and second solder blocks, and a difference between the total height of each of the chips is in a range 0.0 mm to 0.1 mm.

12. The fully molded power electronic module of claim 9 further comprising:

a third plurality of solder blocks that contact the first DBC substrate and contact the second DBC substrate.

13. The fully molded power electronic module of claim 9, wherein six spacers are spaced around a perimeter of the fully molded power electronic module.

14. The fully molded power electronic module of claim 9, wherein the spacers are positioned adjacent four corners of the fully molded power electronic module.

15. The fully molded power electronic module of claim 9, wherein the spacers are formed of silicon and have a cross sectional shape as one of a circle-shape and a polygon-shape.

16. A method of fabricating a power electronic package, comprising:

providing a first direct bonded copper (DBC) substrate having an electrically non-conductive region and an electrically conductive region;

providing a second DBC substrate having a first solder base that holds a first chip, having a second solder base that holds a second chip, having an electrically non-conductive region and an electrically conductive region;

determining, by analyzing thermal properties and reliability performance of the first and second DBC substrates and the first chip, a thickness of the first solder base and a thickness of a first solder block disposed between the first chip and the first DBC substrate;

calculating a first height by adding the thickness of the first solder base together with a thickness of the first chip and the thickness of the first solder block;

determining, by analyzing thermal properties and reliability performance of the first and second DBC substrates and the second chip, a thickness of the second solder base and a thickness of a second solder block disposed between the second chip and the first DBC substrate;

calculating a second height by adding the thickness of the second solder base together with a thickness of the second chip and the thickness of the second solder block;

determining an optimized height by taking an average of the first height and the second height when a difference between the first height and the second height is less than 0.1 mm; and mounting, between the first and second DBC substrates, at least three spacers that have a height equal to the optimized height.

17. The method of claim 16, wherein the height of the first solder block is 60% to 80% of a width of the first solder block, and the height of the second solder block is 60% to 80% of a width of the second solder block.

18. The method of claim 16 further comprising:

disposing a third solder block that contacts the electrically conductive region of the first DBC substrate and that contacts the electrically conductive region of the second DBC substrate.

19. The method of claim 16 further comprising:

pressing the first DBC substrate against the second DBC substrate until the spacers contact the electrically non-conductive region of the second DBC substrate.

20. The method of claim 16 further comprising:

flowing an encapsulant to encapsulate the power electronic package.

* * * * *